United States Patent [19]
Tran

[11] Patent Number: 5,835,412
[45] Date of Patent: Nov. 10, 1998

[54] LINEARIZED STORAGE CELL FOR INTEGRATED CIRCUIT ANALOG SIGNAL RECORDING AND PLAYBACK

[75] Inventor: Hieu Van Tran, San Jose, Calif.

[73] Assignee: Information Storage Devices, Inc., San Jose, Calif.

[21] Appl. No.: 926,764

[22] Filed: Sep. 8, 1997

Related U.S. Application Data

[63] Continuation of Ser. No. 651,949, May 21, 1996, abandoned.

[51] Int. Cl.$^6$ ..................................................... G11C 11/34
[52] U.S. Cl. .................................. 365/185.21; 365/185.2
[58] Field of Search ............................ 365/185.18, 185.2, 365/185.21, 185.24

[56] References Cited

U.S. PATENT DOCUMENTS

| | | | |
|---|---|---|---|
| 5,055,897 | 10/1991 | Canepa et al. | 365/185.2 |
| 5,220,531 | 6/1993 | Blyth et al. | 365/189.07 |
| 5,253,201 | 10/1993 | Atsumi et al. | 365/185.2 |
| 5,467,306 | 11/1995 | Kaya et al. | 365/185.2 |
| 5,694,356 | 12/1997 | Wong et al. | 365/185.03 |

FOREIGN PATENT DOCUMENTS 57-176598  10/1982  Japan .

*Primary Examiner*—David C. Nelms
*Assistant Examiner*—Michael T. Tran
*Attorney, Agent, or Firm*—Blakely, Sokoloff, Taylor & Zafman LLP

[57] ABSTRACT

The present invention is a method and apparatus for reading a storage cell configured in a negative feedback mode to provide linear variation of cell current with the threshold of the cell. The apparatus comprises a floating gate storage cell having a source, a gate, a floating gate and a drain. The source of the floating gate storage cell has a first predetermined reference voltage and the gate of the floating gate storage cell has a predetermined second reference voltage. The apparatus also comprises first circuitry driving the voltage on the drain of the floating gate storage cell to a third predetermined reference voltage, the first, second and third predetermined reference voltages being selected to not change a threshold voltage of the storage cell. The apparatus further comprises second circuitry providing an output proportional to the current passing through the floating gate storage cell while the first, second and third predetermined reference voltages are applied.

24 Claims, 2 Drawing Sheets

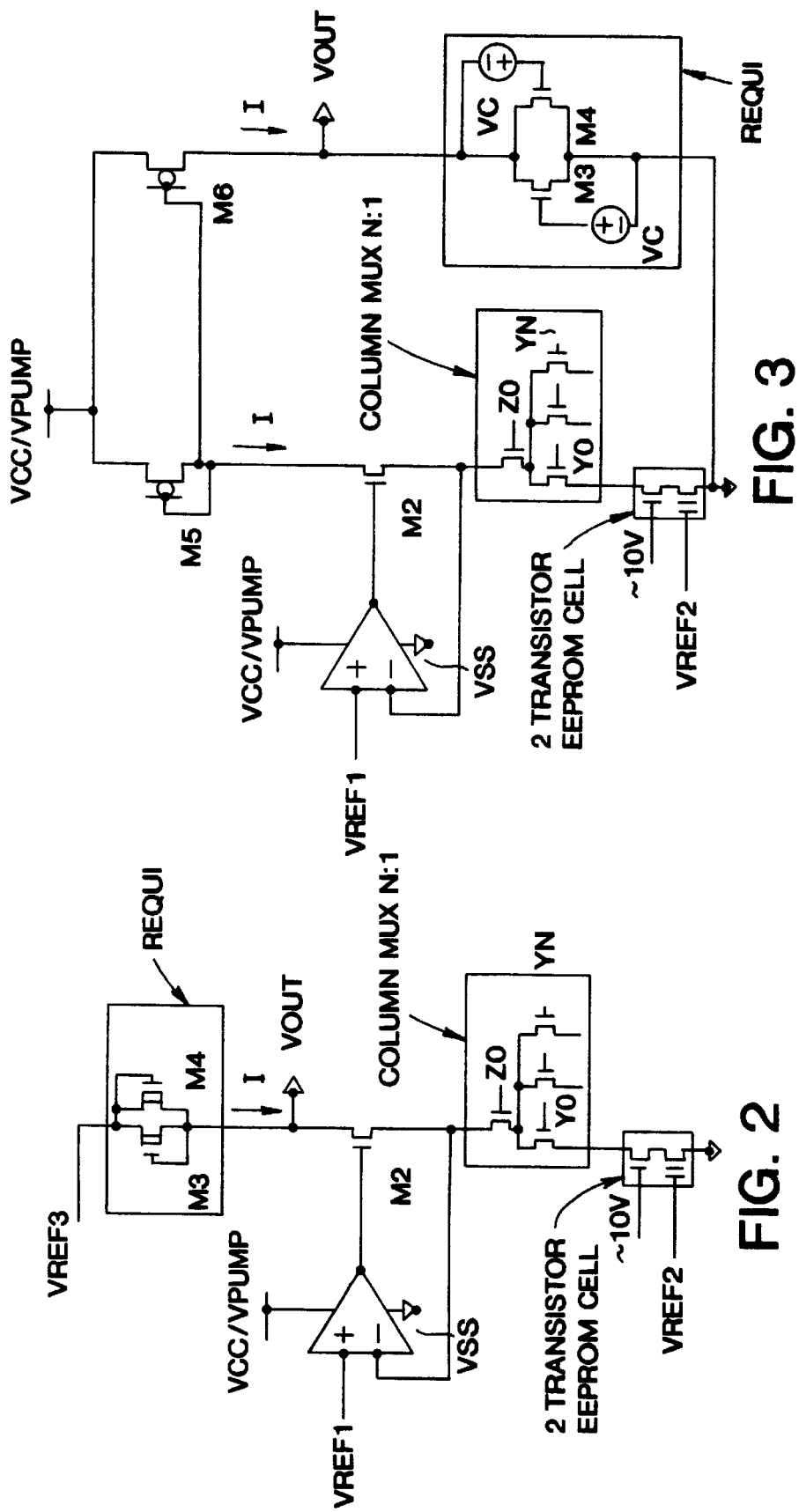

LINEARIZED STORAGE CELL FOR INTEGRATED CIRCUIT ANALOG SIGNAL RECORDING AND PLAYBACK

This is a Continuation application of application Ser. No. 08/651,949, filed May 21, 1996 now abandoned.

BACKGROUND OF THE INVENTION

1. Field of the Invention

The present invention relates to the field of integrated circuit design, more specifically to integrated circuit analog signal recording and playback utilizing non-volatile memory integrated circuits.

2. Prior Art

In U.S. Pat. No. 5,220,531 by Trevor Blyth and Richard Simko, EEPROM (electrically erasable programmable read only memory) memory cells are used for analog signal recording and playback. These cells are comprised of a floating gate device having a source, a drain, a gate and a floating gate wherein the threshold of the device as measured between the gate and the source of the device is determined (controlled) by the charge on the floating gate. These cells are erased using Fowler-Nordheim tunneling by applying a high voltage, e.g. 21 V on the gate, zero volts on the source, and zero volts on the drain. The high voltage on the gate capacitively couples to the floating gate, which creates a high electric field through the tunnel oxide between the floating gate and the drain. This electric field causes electrons to tunnel to the floating gate, which effectively raises the $V_t$ (threshold voltage) to about 6 V. Next the cell is programmed using the same Fowler-Nordheim tunneling mechanism by applying a high voltage on the drain, e.g. 9 to 19 volts, zero volts on the gate, and 6 V on the source. The high voltage on the drain causes a high electric field through the tunnel oxide between the floating gate and the drain in the reverse direction. This causes electrons to tunnel from the floating gate to the drain, causing the threshold voltage to be lowered (depleted), e.g. −1 V to +3 V, depending on the voltage level on the drain and the pulse width.

In U.S. Pat. No. 5,220,531, the program "pulse" is divided into a series of coarse pulses and a series of fine pulses to store an analog signal in the non-volatile memory cell. After each programming pulse, the content of the cell is read using a read cycle and compared with the analog signal to be stored, with the coarse pulses terminating when the desired programmed level is approached, and the fine pulses terminating when the desired programmed level is reached. The coarse write/read/compare series followed by the fine write/read/compare series provides superior analog signal resolution in the stored signal.

In the above patent, the dynamic range of the cell is about 3 V, with an analog resolution of about 12 millivolts, giving an effective resolution equivalent to a digital storage of about 8 bits (each cell has a resolution of 12/3000, or about 1 part in 250). Each high voltage coarse pulse and fine pulse is divided into an equal ramp-up time portion and a flat time portion, and a sample and compare enable time portion. The compare time portion is used to read back the voltage stored in the memory cell after each incremental coarse or fine programming pulse to determine if it reaches a desired value. The sample time portion is used to take the next sample of the input signal and hold it. The sample and compare time portion is the quiet time, i.e. the high voltage source such as the charge pump is disabled during this time to minimize noise. The step voltage between successive coarse levels is approximately 220 millivolts and the step voltage between successive fine levels is approximately 22 millivolts, which is equivalent to a resolution of 12 mV in the stored voltage in the memory cell. The large step voltage for the coarse levels is required to cover the full range of the cell programming threshold window plus an additional voltage margin, which ranges from approximately 9 to 19 volts on the drain of the memory cell, corresponding to about 0–3 v of the memory cell threshold voltage, approximately the analog dynamic range of the memory cell. The number of coarse pulses available is chosen to be 45, which translates into 45×220 mV=10 volts full range. The large coarse step is used to achieve the short writing time. The fine ramp full range is chosen to be about 2 V. 90 fine pulses are available, giving a writing resolution of about 22 mV.

In the read mode, the storage cell is configured as a source follower with a constant load current from the drain to ground. The gate and the source of the memory cell are connected together, the drain of the memory cell is connected to a constant bias current, and the gate of the select transistor is connected to an intermediate voltage, e.g. 10 V, to eliminate the gate voltage drop effect and the resistive effect from the small size of the select gate. A regulated power supply, e.g. 3.5 V, is connected to the gate/source of the memory cell to avoid the variation of the gate/source voltage on the cell readout voltage. The voltage at the drain is the memory cell readout voltage. Thus the cell is connected as a source follower with the drain and source functionally interchanged. This results in a linear relationship between the threshold of the cell and the cell readout voltage. The storage cell is thus operated in the saturation region since the gate and source are effectively tied together.

Since the source of the source follower storage cell is shared with all the memory cells in the array, it has a huge associated capacitance from all the diffusion junctions. In addition, in the read mode, assuming all the cells in the selected row have a low threshold voltage (i.e., the cells are conductive), since the source and gate of the source follower cell is charged to a regulated voltage, for example 3.5 v, all the bitlines in the array are also being charged to approximately the same voltage by all conductive memory cells. This means that in the read mode, the capacitive loading on the regulating circuit includes all the memory cell source junction capacitances and all the bitline capacitances. This puts a severe requirement on the regulating circuit. This also makes it difficult to extend the dynamic range of the memory cell, especially when the memory is to operate from a low voltage power supply, because the heavy capacitive loading makes it difficult to pump up the regulating voltage to the required level.

BRIEF SUMMARY OF THE INVENTION

It is an objective of this invention to provide a linearized storage cell in which in the read mode, the cell is used in the linear region in a negative feedback mode, resulting in a linear variation of cell current with the threshold of the cell. By imposing the cell current across an equivalent active MOS resistor, a cell read-out voltage linearly dependent on the cell threshold voltage is achieved.

The iterative write sequence of the preferred embodiment of the present invention starts with an erase using Fowler-Nordheim tunneling between the gate and the source/drain/channel to erase the cell to a high threshold level, e.g. $V_t$=6 V, as in the prior art. The following programming pulses also use Fowler-Nordheim tunneling between the drain and the gate to incrementally deplete the charge from the floating gate. As in the prior art, the programming is divided into a series of coarse pulses and a series of fine pulses to achieve the refined resolution in a reduced programming time.

For readback, the linearized storage cell is connected in a negative feedback mode. The cell drain is logically connected to the negative terminal of an op amp (operational amplifier). A first reference voltage is connected to the positive terminal of the op amp, the first reference voltage being low enough to ensure the cell gate voltage is higher than the sum of the cell drain voltage and the highest cell threshold. A second reference voltage is logically connected to the cell gate, the second reference voltage being high enough to ensure the cell gate voltage is higher than the sum of the cell drain voltage and the highest cell threshold to make sure the cell is always operating in the linear region, no matter what the threshold. The output of the op amp is connected to the gate of an n-MOS device logically connected in series with the drain of the cell.

The negative feedback of the op amp will force the drain of the memory cell to be the same voltage as the first reference voltage. By the well known linear MOS equation:

$$I = \beta[(V_{gs} - V_t)*V_{ds} - (V_{ds})^2/2]$$

where:

$\beta = \mu n\, C_{ox}\, W/L$, $\mu n$=mobility of the channel region of the MOSFET devices $C_{ox}$=gate oxide capacitance per unit area W/L=ratio of width to length of the channel region of the MOSFET device $V_{gs}$=gate—source voltage of the MOSFET device $V_t$=threshold voltage of the MOSFET device $V_{ds}$=drain—source voltage of the MOSFET device With a fixed $V_{gs}$ and fixed $V_{ds}$:

$$\frac{\partial I}{\partial V_t} = -\beta V_{ds}$$

Thus a change in the threshold voltage $V_t$ will cause a proportional change in the current I through the cell, achieving a linear relationship between the cell threshold and the cell current. By imposing the cell current across a resistor, a cell readout voltage having a linear relationship with the cell threshold is realized. To eliminate the effect of the mobility variation, the resistor is realized as an active MOS device so that its effective resistance is proportional to $1/\beta$. This will cancel out the $\beta$ dependence of the memory cell in the foregoing equation.

Because the storage cell is read from the drain junction, the shared source junction capacitance has no effect. Also since there is no regulating voltage on the source, there is no charging of the unselected bitlines.

BRIEF DESCRIPTION OF THE DRAWINGS

FIG. 2 illustrates a first embodiment linearized storage cell connected for readback in accordance with the present invention.

FIG. 3 illustrates an alternate embodiment linearized storage cell connected for readback in accordance with the present invention.

DETAILED DESCRIPTION OF THE INVENTION

Figure 1:
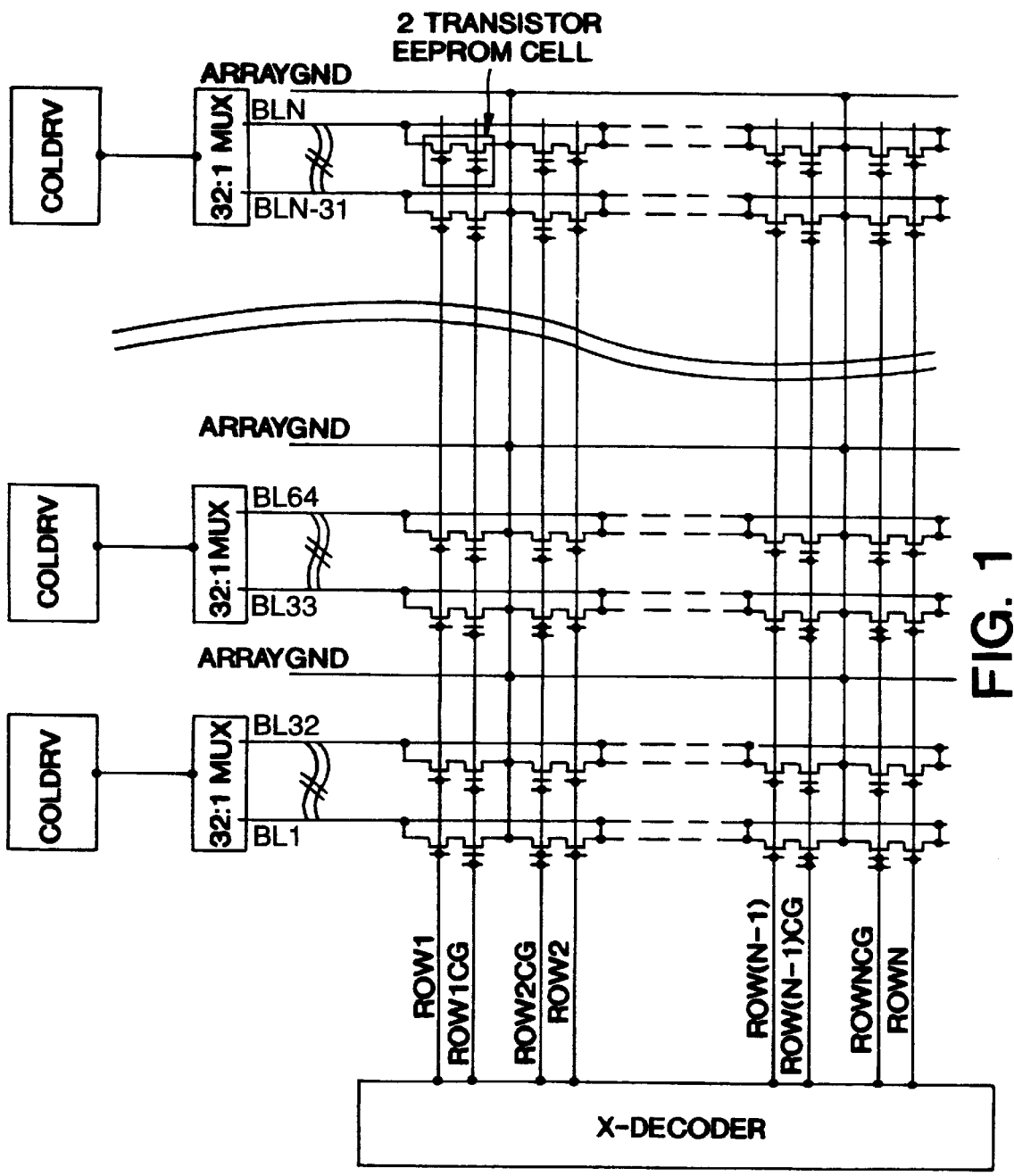
FIG. 1 is a diagram of a storage array architecture applicable to the present invention.

First referring to FIG. 1, a storage array architecture applicable to the present invention may be seen. In this specific architecture, applicable to the devices discussed in the prior art section, 100 column drivers COLDRV are coupled through 100 32:1 MUXes so as to be controllably coupleable to 3200 columns of memory cells in groups of 100 at a time. Each column line is connected to a plurality of 2 transistor EEPROM cells, the cells being arranged in pairs symmetrically about commonly connected array ground lines. Each 2 transistor EEPROM cell consists of an n-channel device M1 and a floating gate n-channel device FM1 connected in series. The gates of all n-channel devices in each row of the array are connected in common to the X-DECODER by lines ROW1, ROW2, etc. to form the row select devices of the array. Also the gates of all floating gate n-channel devices in each row of the array are connected in common to the X-DECODER to provide the row control gates ROW1CG, ROW2CG, etc. of the array.

FIG. 2 illustrates the linearized storage cell connected for readback in accordance with the present invention. The basic storage cell is the typical two transistor EEPROM memory cell just described, comprised of n-channel transistor M1 and floating gate transistor FM1 (see also FIG. 1 showing an array of n-channel transistor and floating gate transistor cells, the individual transistors in the cells of FIG. 1 not being labeled because of the scale of the Figure). The select gate, the gate SG of transistor M1, is connected to an intermediate level, e.g. 10 V, to eliminate the gate voltage drop and resistor effect from the small size of the select device. The gate of the floating gate transistor is logically connected to a reference voltage VREF2 (for example by the row decoder X-DECODER of FIG. 1). VREF2 should be=$V_{tmax}$ (highest cell threshold)+cell drain voltage (VREF1) to ensure the memory cell operating in the linear region. VREF2 could be regulated from a charge pump to extend the linear range since it only drives the gates of the memory cells.

The devices Y0 through YN, together with device Z0, form a 32:1 COLUMN MUX corresponding to one of the 32:1 MUXes of FIG. 1. For erasing and programming of the cells, the array is configured as in FIG. 1, whereas for reading of the cells, the column drivers are disabled and the cell or cells being read are instead connected as shown in FIG. 2, or alternatively, as shown in FIG. 3.

The operational amplifier OP AMP is a typical MOS differential operational amplifier operating from VCC or a higher voltage VPUMP generated by a conventional charge pump. The positive input of the operational amplifier is connected to a first reference voltage VREF1. The negative input of the operational amplifier is connected to the drain of the select transistor M1 through the additional n-MOS column decoding (Y0-YN, Z0). The gate voltages of the column decoding n-MOS transistors are equal to ground when deselected, equal to the high voltage (e.g. 21 V) when selected in programming, and equal to an intermediate level (e.g. 10 V) when selected in read mode to eliminate the gate voltage drop effect and resistor effect resulting from the small size of the n-MOS transistors.

The output of the operational amplifier is connected to the gate of n-MOS device M2, which has its source connected with the drain of the select transistor M1 through the n-MOS column decoding transistors.

An active MOS resistor formed of n-channel depletion devices M3 and M4 is connected between a third reference voltage source VREF3 regulated from VCC (or a charge pump output to extend the range) and the drain of transistor M2. VREF3 is the maximum cell readout voltage, which will occur when the cell current is zero. Two depletion n-MOS transistors are used to form the active MOS resistor to eliminate the VDS effect, as described in the text entitled "VLSI Design Techniques for Analog and Digital Circuits" by Randall L. Geiger et al., McGraw Hill, 1990, pp. 308–318. Other active MOS resistor structures are also possible, as described in the above text. Further, an EEPROM cell could also be used as an active MOS resistor to achieve better matching between the resistor and the memory cell.

The operational amplifier, the resistor (devices M3 and M4), the series n-MOS devices comprising device M2 and the column decode devices are part of the column driver circuit which drives the high voltage into the column in programming and also serves to read the voltage out of the memory cell during readback. By negative feedback action, the operational amplifier will force the cell drain voltage to be equal to the first reference voltage VREF1. This causes the memory cell to operate in the linear mode, since VREF2 is higher than the sum of the cell threshold ($V_t$) and the cell drain voltage (VREF1). Thus:

$$I = \beta[(V_{gs}-V_t)*V_{ds}-(V_{ds})^2/2]$$

where:

$V_{gs} > V_{ds} + V_t$ $\beta = \mu n\, C_{ox}\, W_e/L_e$ of memory cell (the subscript e indicates an enhancement device)

Therefore:

$$I = \beta[(VREF2-V_t)*VREF1-VREF1*VREF1*0.5]$$

This can be rearranged to give:

$$I = A - B*V_t$$

where

A=$\beta$*K, with K=[VREF2*VREF1−VREF1*VREF1*0.5] =a constant

B=$\beta$*VREF1

This is a linear relationship between the cell threshold and the cell current.

The equivalent resistance of the depletion active resistor MOS transistors is:

$$R_{eq} = 1/(2*\beta_d*V_{td})$$

where $\beta_d = \mu_d\, C_{oxd}\, W_d/L_d$ (the subscript d indicates depletion devices)

$V_{td}$=depletion device threshold

Hence the voltage drop across the resistor is:

$$V_R = I*R_{eq} = A' - B'*V_t$$

where

A'=K*$\beta$/(2*$\beta_d$*$V_{td}$)=K*C*($W_e/L_e$)/($W_d/L_d$)*1/(2*$V_{td}$)

C=($\mu$n $C_{ox}$)/($\mu$d $C_{oxd}$)=a constant

Or:

A'=D*($W_e/L_e$)/($W_d/L_d$)*1/$V_{td}$, and

B'=$\beta$/(2*$\beta_d$*$V_{td}$)*VREF1=E*($W_e/L_e$)/($W_d/L_d$)*1/$V_{td}$ where

D=K*C*0.5

E=C*VREF1*0.5

Finally:

$$V_R = (W_e/L_e)/(W_d/L_d)*1/V_{td}*[D-E*V_t]$$

VOUT=VREF3−$V_R$

Thus there is a linear relationship between the cell threshold and the cell readout voltage. Also, given a fixed $W_e/L_e$ of a memory cell, $W_d/L_d$ could be varied to adjust the output voltage range VOUT (this is equivalent to varying the effective resistance of the active depletion MOS). The temperature effect on the threshold voltage can be minimized by a reference scheme such as the one described by Richard T. Simko in the U.S. Pat. No. 5,126,967.

Now referring to FIG. 3, an alternate implementation of the linearized storage cell of the present invention may be seen. The basic storage cell and the operational amplifier configuration is same as in FIG. 2. However the cell current is mirrored by the p-MOS transistors M5 and M6 to an active MOS resistor (devices M3 and M4) referenced to the ground instead of a high supply voltage. Since the active MOS resistor is referred to ground, bulk source effect of the MOS device is eliminated, leading to a more linearized resistor. Also VOUT is now referenced to ground.

Referring again to FIG. 3, an alternate MOS structure is illustrated. Here the resistor is realized as two enhancement n-MOS transistors M3 and M4, with gate and drain of device M3 connected to a floating voltage source VC and the gate and source of device M4 connected to another floating voltage source VC. VC should be chosen to be VC=VOUT$_{max}$+$V_{tn}$ to satisfy the linear condition for the active resistor MOS transistors M3 and M4 ($V_{tn}$ is the threshold voltage of the n-MOS transistors M3 and M4 forming the resistor). Each of the voltages VC can be supplied from a charge pump since the voltages only have to drive the gates of transistors M3 and M4. This resistor structure is also described in the same text mentioned above by Randall L. Geiger et al., pp. 308–318. Additional descriptions of the active MOS resistors and floating voltage source realizations can be found in the text entitled "Analog MOS I.C. for Signal Processing" by Roubik Gregorian and Gabor C. Temes, John Wiley & Sons, 1986, pp. 387–400.

The equivalent resistance of the enhancement active MOS transistors is:

$$R_{eq} = 1/(2*\beta_n\, (VC-V_{tn}))$$

where $\beta_n = \mu n\, C_{ox}\, W_n/L_n$ of the transistors M3 and M4 (the subscript n indicates the n-channel devices)

$V_{tn}$=the threshold voltage of transistors M3 and M4

The VOUT equation is thus modified from above to be:

$$VOUT = (W_e/L_e)/(W_n/L_n)*1/(VC-V_{tn})*[D-E*V_t]$$

This is also a linear relationship between the cell threshold and the cell readout voltage. Also, given a fixed $W_e/L_e$ of a memory cell, $W_n/L_n$ and VC could be varied to adjust the output voltage range VOUT (this is equivalent to varying the effective resistance of the active enhancement MOS).

As before, the temperature effect on the threshold voltage could be minimized by a reference scheme such as the one described by Richard T. Simko in U.S. Pat. No. 5,126,967.

Note that the above analysis using the equivalent MOS equations for the linearized storage cell has ignored the effect of the voltage coupling from the drain of the memory cell into the floating gate. A similar analysis taking the drain coupling effect into account also results in a linear relationship between the memory cell threshold voltage and the memory cell readout voltage. Also, the various reference voltages called for by the circuits described herein may be supplied from a well known reference circuit such as a standard CMOS bandgap reference.

The present invention has been described with respect to a preferred embodiment, specifically one configured for the storage and playback of analog samples of an analog signal. However the invention is also applicable to systems configured for the storage of digital signals, either in the usual one bit (two states) per storage cell, or more importantly, in a multilevel storage format providing more than two distinct levels representing more than one digital bit per storage cell. Such multilevel digital storage systems would use a digital to analog converter to convert the input digital signals to a respective one of the multiple analog levels, wherein the levels are sufficiently separated in voltage from each other to remain distinct and unambiguous throughout prolonged storage, over the operating temperature range, repeated reprogramming of other cells on the same integrated circuit, after repeated readback and conversion back to digital form by an analog to digital converter, etc. For instance, one might store M bits of digital information per storage cell by using $2^M$ distinct storage levels per cell, where M is an integer, for example, 3 or 4. Alternatively, one could use three cells to store the equivalent of eight bits by storing any of eight distinct levels in two of the three cells and storing any of four distinct levels the third cell.

Thus while the present invention has been disclosed and described with respect to certain preferred embodiments thereof, it will be understood by those skilled in the art that the present invention may be varied without departing from the spirit and scope thereof.

I claim:

1. A method of reading a voltage stored in a floating gate storage cell having a source, a gate, a floating gate and a drain comprising the steps of:
   (a) applying predetermined reference voltages to the source, gate and drain of the floating gate storage cell during a read operation, the predetermined voltages being selected to not change a threshold voltage of the storage cell; and
   (b) providing an output proportional to the current passing through the floating gate storage cell while the predetermined reference voltages are applied.

2. The method of claim 1, wherein in step (b) the output is an output voltage.

3. The method of claim 2 wherein step (b) comprises the step of directing the current passing through the floating gate storage cell through a resistor.

4. The method of claim 3 wherein the resistor is an active MOS resistor.

5. The method of claim 2 wherein step (b) comprises the step of directing through a resistor, a current proportional to the current passing through the floating gate storage cell.

6. The method of claim 5 wherein the resistor is an active MOS resistor.

7. The method of claim 1 or claim 2 wherein the step of applying a reference voltage to the drain of the floating gate storage cell comprises the steps of providing a MOS transistor having a source, a gate and a drain, coupling the source of the MOS transistor to the drain of the floating gate storage cell and driving the gate of the MOS transistor to a voltage which drives the voltage on the source of the MOS transistor to the respective reference voltage.

8. The method of claim 7 wherein the step of coupling the source of the MOS transistor to the drain of the floating gate storage cell comprises the step of coupling the source of the MOS transistor to the drain of the floating gate storage cell through a column multiplexer for selecting for reading, the floating gate storage cell in any one of N columns of floating gate storage cells.

9. The method of claim 7 wherein the step of driving the gate of the MOS transistor to a voltage which drives the voltage on the source of the MOS transistor to the respective reference voltage comprises the step of coupling the output of an operational amplifier to the gate of the MOS transistor and coupling the source of the MOS transistor to the negative input of the operational amplifier, and coupling the positive input of the operational amplifier to the respective reference voltage.

10. The method of either claim 1 or claim 2 wherein the reference voltage applied to the source of the floating gate storage cell is a circuit ground voltage.

11. The method of claim 10 wherein step (b) comprises the step of directing a current through a resistor, one end of the resistor being coupled to the circuit ground, wherein the current directed through the resistor is proportional to the current passing through the floating gate storage cell.

12. The method of claim 11 wherein the resistor is an active MOS resistor.

13. The method of either claim 1 or claim 2 wherein the voltage stored in the floating gate storage cell is an analog sample of an analog signal.

14. The method of either claim 1 or claim 2 wherein the voltage stored in the floating gate storage cell is one of M discrete voltage levels, where M is an integer greater than 2, representing a digital signal of more than a single bit.

15. The method of either claim 1 or claim 2 wherein the voltage stored in the floating gate storage cell is one of $2^M$ discrete voltage levels, where M is an integer greater than 1, representing a digital signal of M bits.

16. A floating gate storage cell and circuitry for reading the same comprising:
    a floating gate storage cell having a source, a gate, a floating gate and a drain, the source of the floating gate storage cell having a first predetermined reference voltage thereon and the gate of the floating gate storage cell having a predetermined second reference voltage thereon;
    first circuitry driving the voltage on the drain of the floating gate storage cell to a third predetermined reference voltage during a read operation, the first, second and third predetermined reference voltages being selected to not change a threshold voltage of the storage cell; and,
    second circuitry providing an output proportional to the current passing through the floating gate storage cell while the first, second and third predetermined reference voltages are applied.

17. The apparatus of claim 16 wherein the second circuitry is circuitry providing an output voltage which varies in proportion to the current passing through the floating gate storage cell.

18. The apparatus of claim 17 wherein the second circuitry comprises a resistor.

19. The apparatus of claim 18 wherein the resistor is an active MOS resistor.

20. The apparatus of claim 16 wherein the second circuitry comprises a current mirror and a resistor, the current mirror being coupled to the floating gate storage cell and the resistor to mirror a current proportional to the current through the floating gate storage cell to the resistor.

21. The apparatus of claim 20 wherein the resistor is an active MOS resistor.

22. The apparatus of claim 16 wherein the first circuitry comprises a operational amplifier having positive and negative inputs and an output and a MOS transistor having a source, a gate and a drain, the source of the MOS transistor being coupled to the drain of the floating gate storage cell and to the negative input of the operational amplifier, the gate of the MOS transistor being coupled to the output of the operational amplifier and the positive input of the operational amplifier being coupled to the third reference voltage.

23. The apparatus of claim 22 wherein the source of the MOS transistor is coupled to the drain of the floating gate storage cell through a column multiplexer for selecting for reading, the floating gate storage cell in one of N columns of floating gate storage cells.

24. The apparatus of either claim 16 or claim 17 wherein the reference voltage applied to the source of the floating gate storage cell is a circuit ground voltage.

* * * * *